(12) United States Patent
Utsuzawa et al.

(10) Patent No.: US 12,117,585 B2
(45) Date of Patent: Oct. 15, 2024

(54) MOTION DETECTION WHILE DRILLING

(71) Applicant: Schlumberger Technology Corporation, Sugar Land, TX (US)

(72) Inventors: Shin Utsuzawa, Sugar Land, TX (US); Nicholas Heaton, Cambridge (GB); Albina Rishatovna Mutina, Clamart (FR); Martin Hurlimann, Newton, MA (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 114 days.

(21) Appl. No.: 18/001,685

(22) PCT Filed: Jul. 9, 2021

(86) PCT No.: PCT/US2021/041041
§ 371 (c)(1),
(2) Date: Dec. 13, 2022

(87) PCT Pub. No.: WO2022/011228
PCT Pub. Date: Jan. 13, 2022

(65) Prior Publication Data
US 2023/0236336 A1    Jul. 27, 2023

Related U.S. Application Data

(60) Provisional application No. 62/705,673, filed on Jul. 10, 2020.

(51) Int. Cl.
*G01V 3/32*    (2006.01)
*G01R 33/44*    (2006.01)

(52) U.S. Cl.
CPC ............. *G01V 3/32* (2013.01); *G01R 33/448* (2013.01)

(58) Field of Classification Search
None
See application file for complete search history.

(56) References Cited

U.S. PATENT DOCUMENTS

| 6,140,817 A | 10/2000 | Flaum et al. |
| 6,437,564 B1 | 8/2002 | Itskovich et al. |
| 2001/0045829 A1* | 11/2001 | Prammer ............. G01N 24/081 324/303 |

(Continued)

FOREIGN PATENT DOCUMENTS

| WO | 2017065962 A1 | 4/2017 |
| WO | 2019135752 A1 | 7/2019 |

OTHER PUBLICATIONS

International Search Report and Written Opinion issued in International Patent application PCT/US2021/041041 on Nov. 1, 2021, 8 pages.

(Continued)

*Primary Examiner* — Jas A Sanghera
(74) *Attorney, Agent, or Firm* — Jeffrey D. Frantz

(57) ABSTRACT

A method for detecting net relative motion between a nuclear magnetic resonance (NMR) tool and a specimen includes disposing the NMR tool and the specimen in sensory range of one another, causing the NMR tool to make NMR measurements of the specimen, and processing the NMR measurements to detect net relative motion between the NMR tool and the specimen.

20 Claims, 6 Drawing Sheets

(56) References Cited

U.S. PATENT DOCUMENTS

| | | |
|---|---|---|
| 2003/0132749 A1* | 7/2003 | Speier .................... G01V 3/32 |
| | | 324/303 |
| 2016/0018555 A1 | 1/2016 | Jachmann et al. |
| 2017/0254919 A1 | 9/2017 | Coman et al. |
| 2019/0271224 A1 | 9/2019 | Utsuzawa et al. |
| 2023/0132749 A1 | 5/2023 | Thomas |

OTHER PUBLICATIONS

Carr et al., "Effects of diffusion on free precession in NMR experiments", Physical Review, 94, May 1954, pp. 630-638.

Meiboom et al., "Modified spin-echo method for measuring nuclear relaxation times," Review of Scientific Instruments, Aug. 29, 1958, pp. 688-691.

Song et al., "T1-T2 correlation spectra obtained using a fast-two-dimensional Laplace inversion", Journal of Magnetic Resonance, 154(2), 2002, pp. 261-268.

Kausik et al. "NMR Relaxometry in Shale and Implications for Logging", Petrophysics 57, 2016, pp. 339-350.

Sezginer et al. "An NMR High-Resolution Permeability Indicator," SPWLA 40th Annual Logging Symposium, paper NNN, 1999, 12 pages.

International Preliminary Report on Patentability issued in International Patent application PCT/US2021/041041 dated Jan. 19, 2023, 6 pages.

Search Report pursuant to Rule 62 EPC issued in European Patent Application 21837884.2 on Jun. 26, 2024, 7 pages.

\* cited by examiner

MOTION DETECTION WHILE DRILLING

CROSS REFERENCE TO RELATED APPLICATION

This application is the National Stage Entry of International Application No. PCT/US2021/041041, filed Jul. 9, 2021, which claims the benefit of U.S. Provisional Application No. 62/705,673 entitled Motion Detection While Drilling, filed Jul. 10, 2020, the entirety of which is incorporated herein by reference.

BACKGROUND

This section is intended to introduce the reader to various aspects of art that may be related to various aspects of the subject matter described and/or claimed below. This discussion is believed to be helpful in providing the reader with background information to facilitate a better understanding of the various aspects of the present disclosure. Accordingly, it should be understood that these statements are to be read in this light, not as admissions of prior art.

The desire for real-time or near real-time information while drilling the borehole gave rise to measurement-while-drilling (MWD) tools and logging-while-drilling (LWD) tools. MWD tools may provide drilling parameter information such as weight-on-bit, torque, shock & vibration, temperature, pressure, rotations-per-minute (rpm), mud flow rate, direction, and inclination. LWD tools may provide formation evaluation measurements such as natural or spectral gamma-ray, resistivity, dielectric, sonic velocity, density, photoelectric factor, neutron porosity, sigma thermal neutron capture cross-section, a variety of neutron induced gamma-ray spectra, and NMR distributions.

Common logging tools include electromagnetic tools, acoustic tools, nuclear tools, and nuclear magnetic resonance (NMR) tools, though various other tool types are also used. NMR tools/instruments can be used to determine properties of earth formations, such as the fractional volume of pore space, the fractional volume of mobile fluid filling the pore space, and the porosity of earth formations. NMR data may also be used to assess the content of brine and hydrocarbons in the formation. General background of NMR well logging is described in commonly assigned U.S. Pat. No. 6,140,817.

The signals measured by nuclear magnetic resonance (NMR) logging tools typically arise from the selected nuclei present in the probed volume. Because hydrogen nuclei are the most abundant and easily detectable, most NMR logging tools are tuned to detect hydrogen resonance signals (from either water or hydrocarbons). These hydrogen nuclei have different dynamic properties (e.g., diffusion rate and tumbling/rotation rate) that are dependent on their environments, such as the chemical structure and size of the molecules in which they reside. The different dynamic properties of these nuclei manifest themselves in different nuclear spin relaxation times (i.e., spin-lattice relaxation time ($T_1$) and spin-spin relaxation time (($T_2$); spin-lattice relaxation is also referred to as longitudinal relaxation, and spin-spin relaxation as transverse relaxation). For example, molecules in viscous oils cannot diffuse or tumble as fast as those in light oils. As a result, they have relatively short relaxation times. These observations suggest that NMR data (e.g., relaxation times) can provide information on molecular properties of hydrocarbons in the earth formations.

NMR measurements are commonly made while drilling. One difficulty with making and interpreting LWD NMR measurements is that motion of the NMR tool can influence the measurements. For example, excessive tool motion can introduce additional signal decay which in turn introduces errors into the NMR measurements. There is a need in the art to better measured NMR tool motion and to mitigate and account for motion induced NMR measurement errors.

SUMMARY

A method for detecting net relative motion between a nuclear magnetic resonance (NMR) tool and a specimen is disclosed. The method includes disposing the NMR tool and the specimen in sensory range of one another, causing the NMR tool to make NMR measurements of the specimen, and processing the NMR measurements to detect net relative motion between the NMR tool and the specimen. The NMR tool may include an LWD NMR tool deployed in a wellbore and the specimen may include a subterranean formation penetrated by the wellbore.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

For a more complete understanding of the disclosed subject matter, and advantages thereof, reference is now made to the following descriptions taken in conjunction with the accompanying drawings, in which.

DETAILED DESCRIPTION

Disclosed embodiments relate generally to downhole NMR methods and downhole NMR tools (e.g., NMR logging while drilling tools) used in making such methods. In some embodiments, by comparing longitudinal relaxation time ($T_1$) and transverse relaxation time ($T_2$), motion of the tool in the borehole, e.g., lateral motion, can be identified. In other embodiments, motion may be evaluated by evaluating sums of echo amplitudes for NMR measurements made under motion (e.g., while drilling) and static conditions. By identifying the motion, data recorded during the motion may be identified so that it can be examined to ensure the motion didn't affect the NMR and other measurements, and/or a driller can take action to mitigate the motion.

Figure 1:
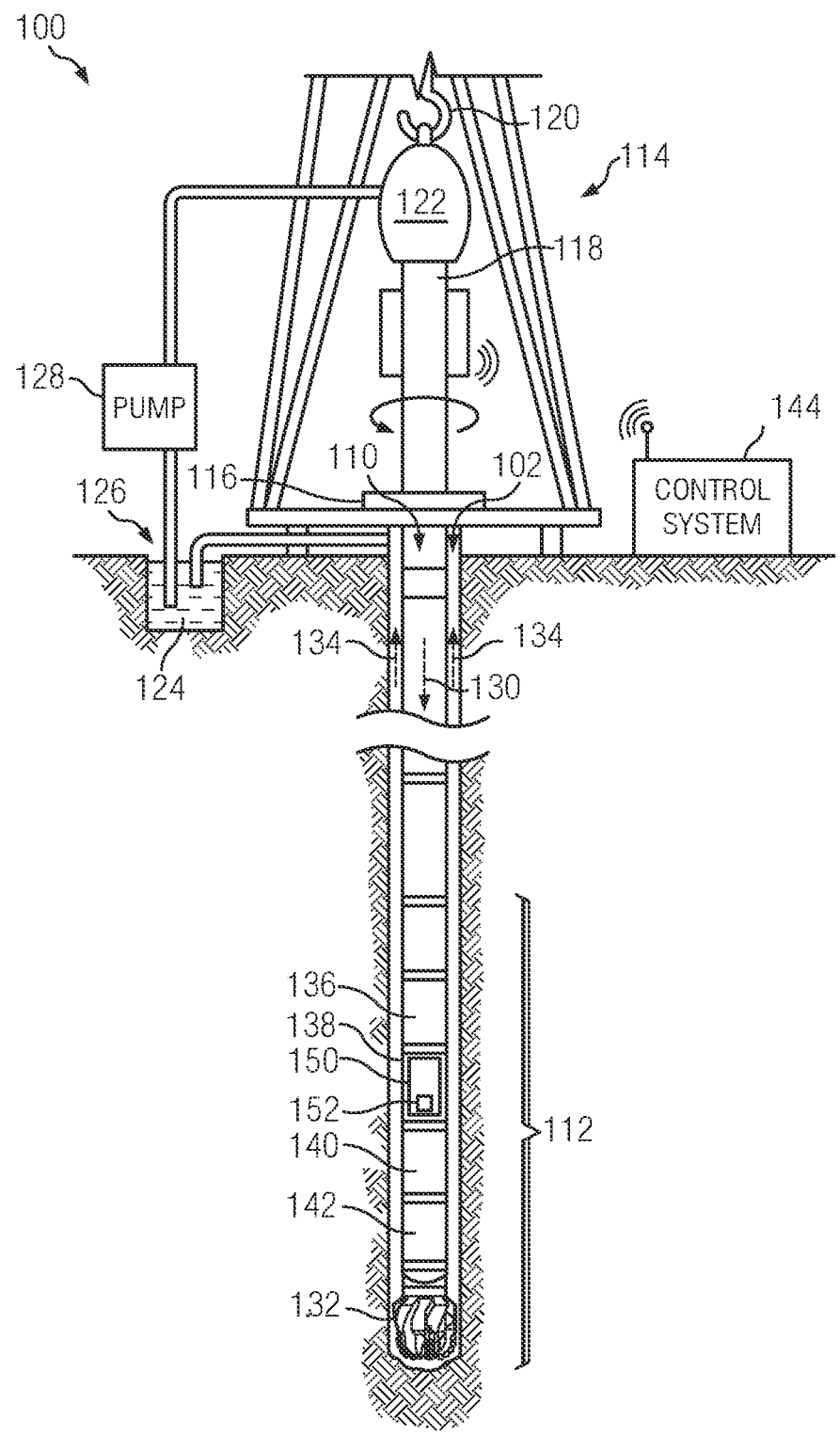
FIG. 1 shows an example of a drilling system.

FIG. 1 depicts a schematic side view of an illustrative well site system 100 including a drill string 110 and a downhole tool 112 disposed within a wellbore 102, according to an embodiment. The well site system 100 may be deployed in either onshore or offshore applications. In this type of system, the wellbore 102 may be formed in subsurface formations by rotary drilling in a manner that is well-known to those skilled in the art. Some embodiments may also use directional drilling.

The drill string 110 may be suspended within the wellbore 102. The well site system 100 may include a platform and derrick assembly 114 positioned over the wellbore 102, with the derrick assembly 114 including a rotary table 116, a kelly 118, a hook 120, and a rotary swivel 122. In a drilling operation, the drill string 110 may be rotated by the rotary table 116, which engages the kelly 118 at the upper end of the drill string 110. The drill string 110 may be suspended from the hook 120, attached to a traveling block (not shown), through the kelly 118 and the rotary swivel 122, which permits rotation of the drill string 110 relative to the hook 120. As is well-known, a top drive system may be used in other embodiments.

Drilling fluid or mud 124 may be stored in a pit 126 formed at the well site. A pump 128 may deliver the drilling fluid 124 to the interior of the drill string 110 via a port in the swivel 122, which causes the drilling fluid 124 to flow downwardly through the drill string 110, as indicated by the directional arrow 130. The drilling fluid exits the drill string 110 via ports in a drill bit 132, and then circulates upwardly through the annulus region between the outside of the drill string 110 and the wall of the wellbore 102, as indicated by the directional arrows 134. In this known manner, the drilling fluid lubricates the drill bit 132 and carries formation cuttings up to the surface as it is returned to the pit 126 for recirculation.

In the illustrated embodiment, the downhole tool 112 may be or include a bottom hole assembly (BHA). The downhole tool 112 is shown as having a rotary steerable system (RSS), a motor 142, and the drill bit 132. The downhole tool 112 may also include a measurement-while-drilling (MWD) tool 136 and one or more logging-while-drilling (LWD) tools (two are shown: 138, 140). The MWD tool 136 may be configured to measure one or more physical properties as the wellbore 102 is being drilled or at any time thereafter. The LWD tools 138, 140 may be configured to measure one or more formation properties and/or wellbore physical properties as the wellbore 102 is being drilled or at any time thereafter. The formation properties may include resistivity, density, porosity, sonic velocity, gamma rays, and the like. The physical properties may include pressure, temperature, wellbore caliper, wellbore trajectory, a weight-on-bit, torque-on-bit, vibration, shock, stick slip, and the like. For example, the LWD tools 138, 140 may be or include one or more NMR logging tools (one is shown: 150). In other embodiments, the NMR logging tool 150 may be a wireline tool rather than part of the LWD tools 138, 140.

With continued reference to FIG. 1, the NMR logging tool 150 may include a detection coil (commonly referred to as an antenna) that may measure the properties of nuclear spins in the formation, such as the longitudinal (or spin-lattice) relaxation time $T_1$, transverse (or spin-spin) relaxation time $T_2$, and a diffusion coefficient D. Knowledge of these NMR properties may help aid in the determination of basic formation properties such as permeability and porosity, as well as the fluid properties such as fluid type and viscosity. Multi-dimensional NMR techniques may provide quantitative fractions of different fluids (e.g., oil, water, gas) and a better understanding of the diffusion properties of these fluids in the surrounding formation, including the effects of geometry and restricted diffusion.

As is known to those of ordinary skill in the art, NMR well logging includes generating a static magnetic field (the $B_0$ field) within a wellbore (e.g., under the earth's surface), applying a series of radio frequency (RF) electromagnetic pulses to the volume around the borehole (the $B_1$ field), measuring signals (echoes) received in response to the RF pulses, and processing the received echoes to determine characteristics of the volume in proximity to the borehole. Conventional characteristics of the volume measured during NMR well logging include $T_1$ and $T_2$ (or distributions of $T_1$ and $T_2$), as well as diffusion coefficients D of the fluid inside the volume. In addition to these one-dimensional (1D) measurements of relaxation times and diffusion coefficients, NMR logs may also provide two-dimensional (2D) maps showing the correlation between diffusion and relaxation times (e.g., D-$T_1$ or D-$T_2$ maps) and the correlation between longitudinal and transverse relaxation times (e.g., $T_1$-$T_2$ maps). These maps may be used to determine formation properties, such as porosity and permeability, as well as fluid properties such as the saturation of oil, water and gas. These 2D maps often enable water, gas, and oil signals to be distinguished, which may enable saturation determinations. Moreover, evaluating the position of the oil signal on the map, may enable the viscosity of the oil to be estimated from various correlations to logarithmic mean relaxation times.

As described above, NMR measurements involve the application of a $B_0$ magnetic field to the magnetic moments (spins) of atoms in the measured sample (or measured volume). In general, the $B_0$ field causes the atoms in the interrogated volume to align along and oscillate (precess) about the axis of the applied magnetic field. NMR measures the return to the equilibrium of this magnetization (i.e., relaxation) after applying a series of RF pulses to tip the magnetization in a direction orthogonal to the applied magnetic field. Longitudinal relaxation due to energy exchange between the spins of the atoms and the surrounding lattice (spin-lattice relaxation) is usually denoted by a time $T_1$ when the longitudinal magnetization has returned to a predetermined percentage (i.e., 63%) of its final value. Longitudinal relaxation involves the component of the spin parallel or anti-parallel to the direction of the magnetic field. Transverse relaxation that results from spins getting out of phase is usually denoted by time $T_2$ when the transverse magnetization has lost a predetermined percentage (i.e., 63%) of its original value.

In oilfield applications, NMR relaxation, such as measured by $T_2$, may be directly proportional to the surface-to-volume ratio of a porous material, for example, as expressed below:

$$\frac{1}{T_n} = \rho_n \cdot \frac{S}{V_p} + \frac{1}{T_{nb}} \tag{1}$$

where S represents the total surface area of the material, $V_p$ represents the pore volume, $\rho_n$ represents the surface relaxivity, $T_{nb}$ represents the bulk relaxation time, and n=1 or 2 denoting the correspondence with $T_1$ or $T_2$. It will be understood that Equation 1 ignores a diffusion contribution which is generally a weak effect in most short echo spacing NMR measurements used downhole. The surface relaxivity $\rho$ is a quantity that defines the strength of the surface relaxation phenomenon and is generally given in units of length (e.g., microns). The relationship given in Equation 1 is one reason that NMR measurements are used extensively in petroleum exploration to obtain estimates of porosity, pore size, bound fluids, permeability, and other rock and fluid properties (i.e., what is commonly referred to as petro-physical data).

Reservoir rocks often exhibit a wide range of $T_2$ values owing to the different pore sizes in the rock. Observed $T_2$ values commonly range from several seconds down to tens of microseconds. Signals at long $T_2$ (e.g., >100 milliseconds) tend to be from fluids in large pores, which are often considered to be producible. At lower $T_2$ values (e.g., 3-50 milliseconds) the fluids are sometimes considered to be bound by capillary force of the pores. For example, in sandstone rocks, $T_2$ is commonly less than 30 milliseconds and the fluids tend not to produce. Signals with even lower $T_2$ values, such as $T_2$<3 ms, may result from clay bound water or viscous (heavy) hydrocarbon. Some rocks contain a significant amount of kerogen that is solid organic matter and may exhibit $T_2$ values as low as tens of microseconds.

The porosity of a formation may be estimated from NMR measurements, for example, as follows:

$$\Phi = \int_{T_{2min}}^{T_{2max}} f(T_2) dT_2 \qquad (2)$$

where $\Phi$ represents the porosity, $f(T_2)$ represents a distribution of $T_2$ values obtained for a fully saturated sample (referred to as the $T_2$ distribution), and $T_{2max}$ and $T_{2min}$ represent the maximum and minimum $T_2$ values in the $T_2$ distribution. As noted above, obtaining an accurate estimation of $T_2$ and porosity is a commercially important indication of the producibility of the fluids in a subterranean formation (e.g., as described above with respect to Equations 1 and 2). At low frequencies used in NMR well logging (<2 MHz), spins are motionally averaged and relax due to dipolar interactions, resulting in $T_1 \approx T_2$.

Figure 2:
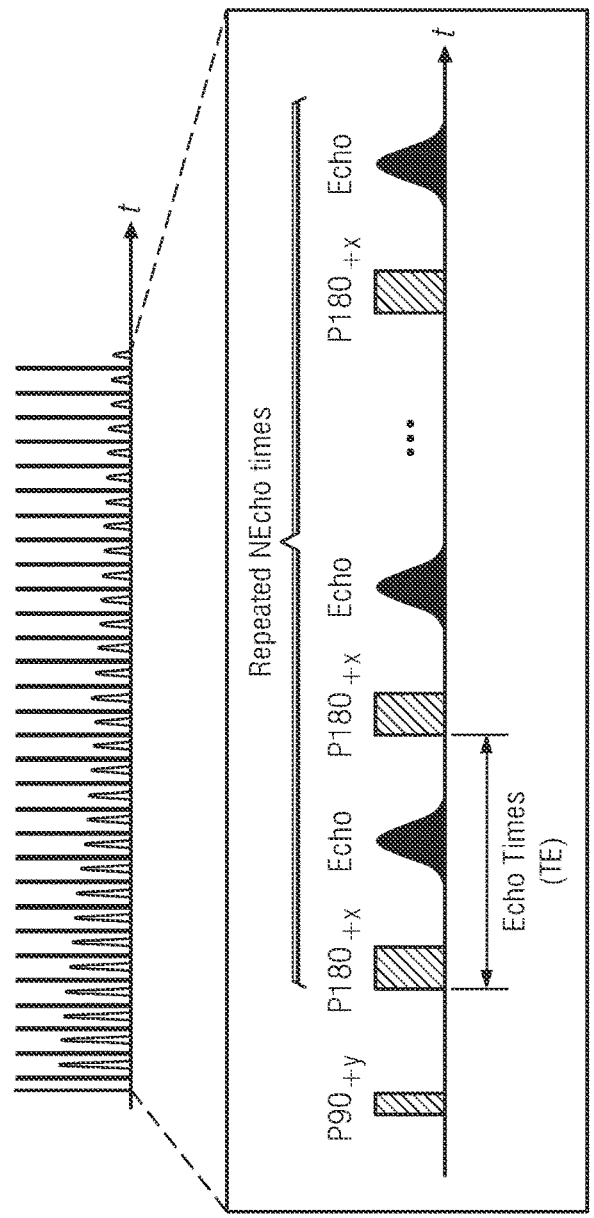
FIG. 2 depicts an example NMR pulse sequence.
Figure 3:
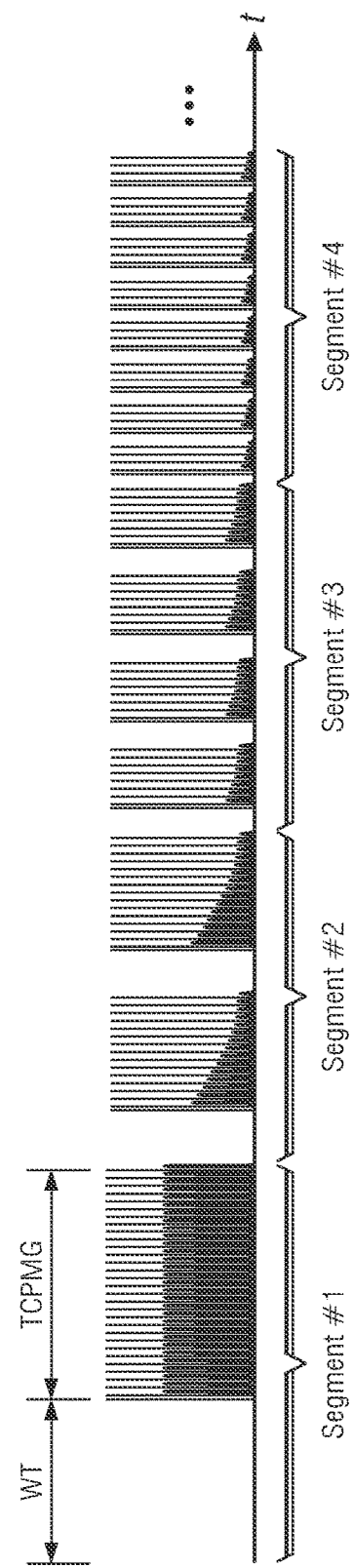
FIG. 3 depicts another example NMR pulse sequence.

NMR measurements may be acquired using particular data acquisition schemes (commonly referred to as pulses or pulse sequences) which describe the timings of transmission and reception of electromagnetic (RF) signals. A Carr-Purcell-Meiboom-Gill (CPMG) pulse sequence is commonly used to make downhole NMR measurements (e.g., to acquire the $T_2$ relaxation time distribution). As depicted in FIGS. 2 and 3, a CPMG pulse sequence (also referred to herein as an echo train) includes an initial idle time or wait time WT to allow the nuclei in the formation fluids to equilibrate with the $B_0$ field which may be induced, for example, by a permanent magnet in the logging tool. Thereafter, a series of radio-frequency pulses are applied using an antenna. Midway between adjacent pulses, NMR signals called echoes are formed and measured using the antenna (with the number of acquired echoes being represented by NEcho). The time spacing between adjacent refocusing pulses is referred to as TE and the time spacing between the excitation pulse and the first refocusing pulse is commonly set to TE/2. The amplitude of the echoes decays or attenuates with time. By fitting the echo amplitudes to a multi-exponential model, the $T_2$ relaxation time distribution may be obtained.

FIG. 3 depicts a common $T_1$-$T_2$ sequence that measures $T_1$-$T_2$ correlation spectrum and includes of a series of CPMG sequences with different WT, NEcho, and TE intended to make measurements over a wide range of sample properties (as is commonly found in subterranean formations). The echo train having a long WT may have sensitivity to long $T_1$-$T_2$ components but is often executed only once (or a few times) owing to the inherently longer measurement time. The echo trains having short WT are often executed multiple times to ensure enough sensitivity to short $T_1$ and short $T_2$. In addition, short echo trains often use a short TE to capture short $T_2$ components that decay quickly.

Figure 4:
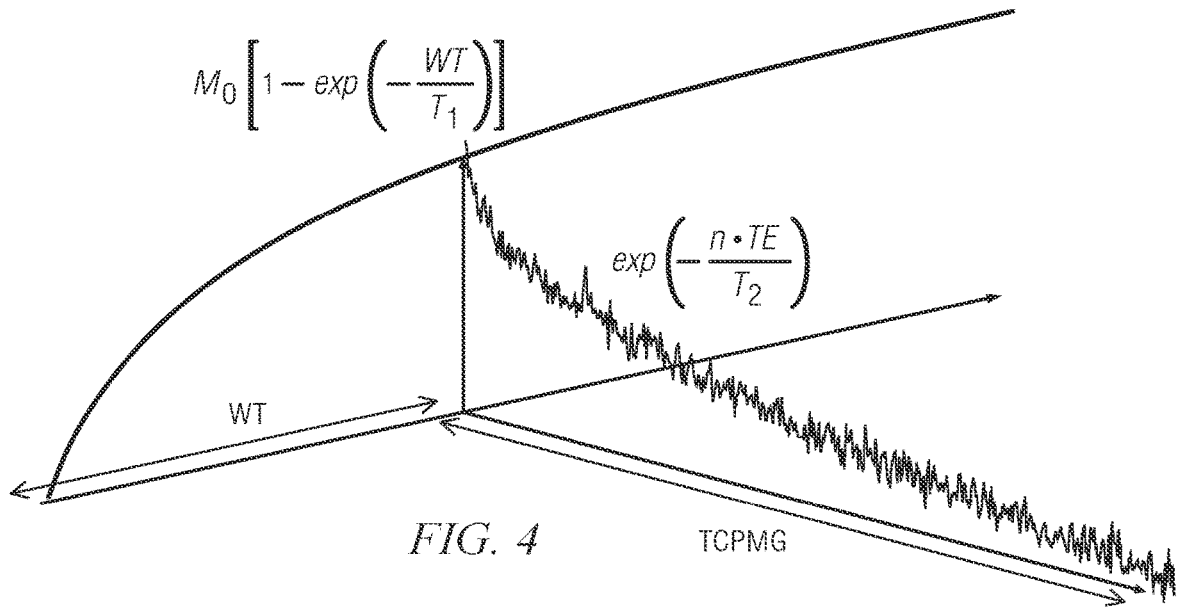
FIG. 4 depicts an example NMR signal obtained using the pulse sequence of FIG. 3.

FIG. 4 depicts a diagram (or a plot) of an NMR signal obtained using a pulse sequence such as that depicted on FIG. 3. NMR measurements that make use of multiple CPMG pulse sequences may be characterized, for example, by following equation:

$$M(t = n \cdot TE) = M_0 \left[ 1 - \exp\left(-\frac{WT}{T_1}\right) \right] \exp\left(-\frac{n \cdot TE}{T_2}\right) \qquad (3)$$

where $M_0$ represents the magnetization in thermal equilibrium and for a unit volume as follows: $M_0 = (\chi/\mu_0) B_0$, $\chi$ represents the nuclear magnetic susceptibility, $\mu_0$ represents the magnetic permeability of free space, and $B_0$ represents the amplitude of the static magnetic field applied by the tool to the sample (e.g., by permanent magnets). The $T_1$ and $T_2$ relaxation times may be obtained, for example, by fitting Equation 3 to a two-dimensional CPMG dataset (a set of measured echo amplitudes) obtained with known WT and TE. If a sample is heterogeneous (as is often found in well logging), Equation 3 may be described by distributions of $T_1$ and $T_2$.

Equation 3 (as expressed above) is valid under the assumption that the NMR logging tool is either static (stationary) in the wellbore or is moving at a negligible speed when the measurements are made. In such scenarios, the tool displacement may be thought of as being much less than the antenna length during execution of the CPMG pulse sequence. In practice however, excessive tool motion (e.g., axial, lateral, rotational, or combinations thereof) may modify the spin physics of the NMR measurement. The drilling process commonly induces complex motion at the NMR sensor, which in turn may cause fluctuation of the magnetic field experienced by spins at a given location. In general, both $T_1$ and $T_2$ measurements are affected by motion, but in different ways and to different degrees. If not properly considered, such motion effects may severely impact both measurement quality and the accuracy of interpretation. Given that NMR logging measurements are commonly made in dynamic conditions (e.g., while drilling in which the tool moves in the wellbore), there is a need in the art for improved logging methods that can measure (or predict) and account for such tool motion.

Figure 5:
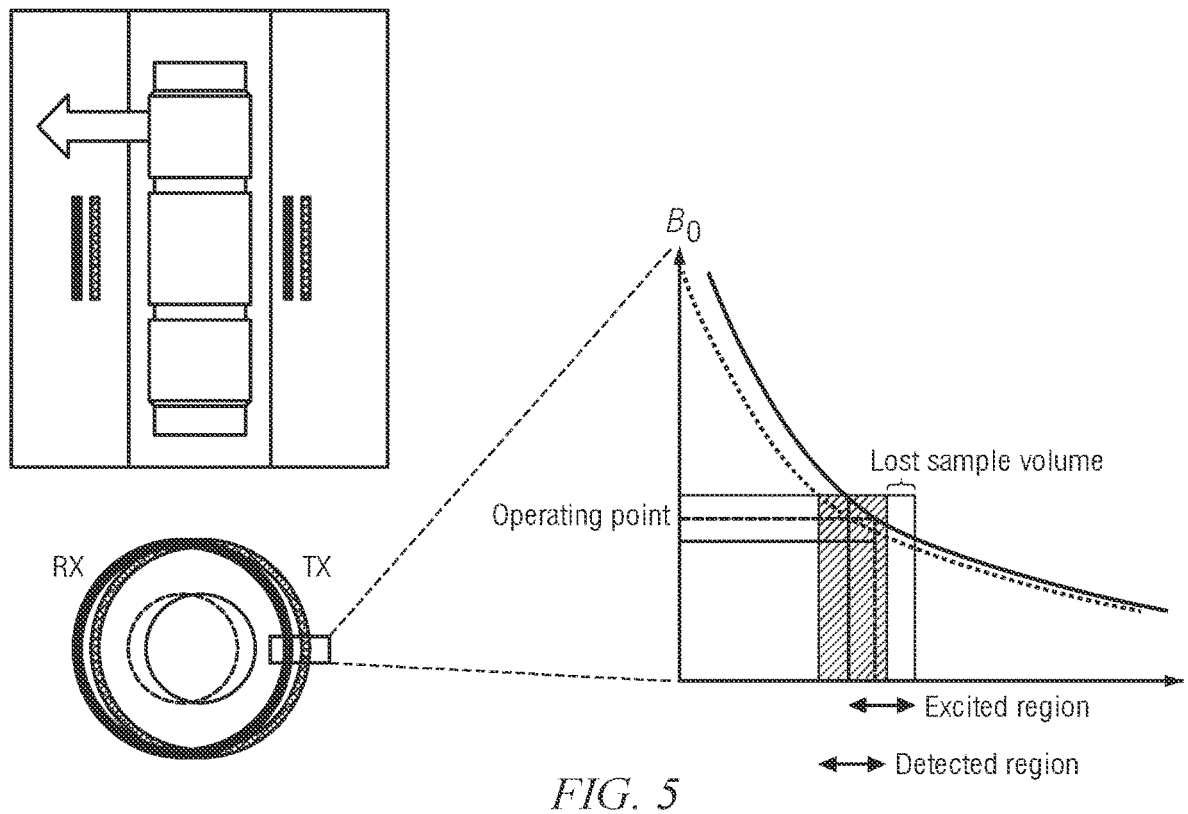
FIG. 5 shows an LWD NMR tool that is moving laterally.

FIG. 5 schematically depicts a schematic (and example) LWD NMR tool located in a borehole illustrating lateral tool motion. The sensitive region (the measurement interrogation region) is usually a thin cylindrical shell or a set of concentric shells as depicted. The radial thickness of the sensitive region (out into the formation in a direction orthogonal to the axis of the tool string) is generally only a few millimeters to one centimeter. This thin measurement region (sensitive region) and the inherent heterogeneity of the generated $B_0$ field causes the NMR measurements to be particularly susceptible to lateral tool motion.

Figure 6:
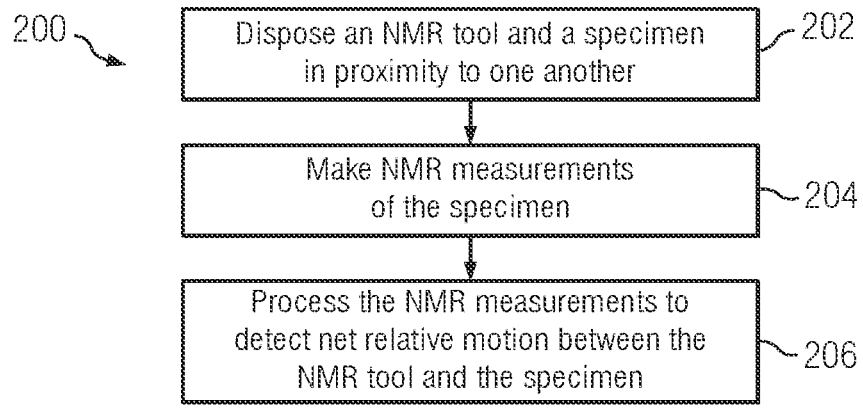
FIG. 6 depicts a flow chart of one example method for detecting motion using NMR data.

FIG. 6 depicts a flow chart of one disclosed method 200 for detecting net relative motion (e.g., lateral motion) between an NMR tool (such an NMR LWD tool) and a specimen (such as a formation through which a subterranean wellbore penetrates). The method 200 includes disposing the NMR tool and the specimen in sensory range of one another at 202. For example, 202 may include deploying an NMR logging tool in a drill string and rotating the drill string in a wellbore to drill the well. NMR measurements of the specimen (e.g., a subterranean formation) are made at 204, for example, while the NMR tool is rotating in the wellbore. The measurements may employ a CPMG pulse train or a pulse train including a plurality of CPMG pulse segments as described above with respect to FIGS. 2, 3, and 4. The NMR measurements are processed at 206 to detect net relative motion between the NMR tool and the specimen (e.g., of the NMR logging tool in the wellbore). In advantageous embodiments, motion may be detected by processing solely the NMR measurements without processing other sensor measurements (e.g., without processing dynamics measurements such as accelerometer and magnetometer measurements).

As described in more detail below, the NMR measurements may be processed, for example, at 206 to compute longitudinal and transverse relaxation times $T_1$ and $T_2$ (e.g., via known inversion techniques). A ratio of $T_1$ to $T_2$ (or mean values thereof) may be computed and compared with a predetermined threshold with increasing ratios being indicative of an increasing motion affect. For example, low values of the $T_1/T_2$ ratio (e.g., less than 3) may indicate minimal (or non-severe) motion, while higher values of the $T_1/T_2$ ratio (e.g., greater than 3, or 5, or 10) may indicate more problematic motion.

With continued reference to FIG. 6 and reference again to FIG. 5, lateral motion of the NMR logging tool by a sizeable fraction of the thickness of the sensitive region during an NMR measurement (which commonly has a duration of a few seconds) causes nuclear spins excited at the beginning of the NMR measurement to move out of sensory range of the NMR sensor. Stated another way, the formation volume within the sensitive region changes with time during the measurement (owing to tool motion) thereby introducing additional signal decay and a corresponding decrease in the measured $T_2$. Increasing tool displacement (e.g., lateral displacement) increases the amount of signal decay and the $T_2$ measurement error. Moreover, for a given motion, the amount of displacement is proportional to measurement time. In addition, rapid variation of an applied magnetic field due to fast motion causes spin dephasing that further reduces signal amplitude. Therefore, the $T_2$ measurement is sensitive to motion (e.g., lateral motion) and the measurement of the long $T_2$ is more affected.

In a $T_1$ measurement, the $$M_0\left[1 - \exp\left(-\frac{WT}{T_1}\right)\right]$$

term in Equation 3 assumes that spins are saturated by the previous CPMG segment and recover towards the thermal equilibrium $M_0$ during the wait time WT with the time constant $T_1$. If the tool moves by a sizeable fraction of the excitation region, the measurement includes a mixture of saturated spins that follow the above equation and fresh spins that are introduced to the sensitive region by motion. The difference between saturated but partially recovered spins and fresh spins introduced by motion is most pronounced when WT is shorter than $T_1$ of the formation (or sample).

This is shown on FIGS. 7A-7D which plots simulated normalized signal amplitude versus time for wait times of 0.2, 0.8, 3.2, and 12.8 seconds for both static (black) and under motion (color) conditions. The simulations were carried out for three distinct samples having (i) $T_1=T_2=0.05$ seconds, (ii) $T_1=T_2=0.4$ seconds, and (iii) $T_1=T_2=3.2$ seconds. Note that the motion (colored lines) introduces additional signal decay as compared to the corresponding sample without motion (note that the signal amplitude for the solid colored lines decays faster than the signal amplitude for the corresponding black dashed lines). This indicates the clear affect that motion has on the $T_2$ measurement. It is also evident that the initial signal amplitude (the time zero amplitude) is affected by motion when the WT is shorter than the sample's $T_1$ value. While the $T_1$ measurement is affected by motion, the $T_1$ measurement appears to be more tolerant to motion than the $T_2$ measurement.

Motion, as described herein, can be any number of problematic types of motion encountered during drilling, e.g., whirl. It will be understood that the detection of problematic motion is not trivial. While some tools have motion sensors, these sensors are usually located at some non-negligible distance from the NMR sensor owing to space constraints such that the measured motion does not necessarily reflect the motion at the location of the NMR sensor. As such, the measured motion does not always correlate well with the observed motion induced affect. Moreover, the motion sensors may include multiple accelerometers configured in such a way that the acceleration at the tool's center of mass is derived by removing rotational components as well as the acceleration due to Earth's gravitational field. However, to obtain the velocity and amplitude of the net motion (which determines the degree of impact on NMR measurement) the measured acceleration must be integrated once or twice. Such integration is well known to be prone to error accumulation.

For a sample with long $T_1$ and $T_2$ decay times, the signal decay during CPMG measurement (characterized by $T_2$) is affected by motion, while initial signal amplitude (characterized by $T_1$) is less affected by motion, as described above. In some embodiments, an anomaly in a $T_1/T_2$ ratio is used to detect excess motion. Free fluids (such as those including producible hydrocarbons) tend to have long $T_1$ and $T_2$ relaxation times and a ratio of $T_1/T_2 \approx 1$ (e.g., $1<T_1/T_2<2$) at the low operating frequencies (e.g., 200-500 kHz) commonly employed in LWD NMR measurements (and in an absence of measurement motion). (see, for example, Kausik et al. "NMR Relaxometry in Shale and Implications for Logging", Petrophysics 57 (2016) 339-350). However, under lateral motion, the apparent $T_1/T_2$ ratio can be significantly higher as described in more detail below.

Figure 8:
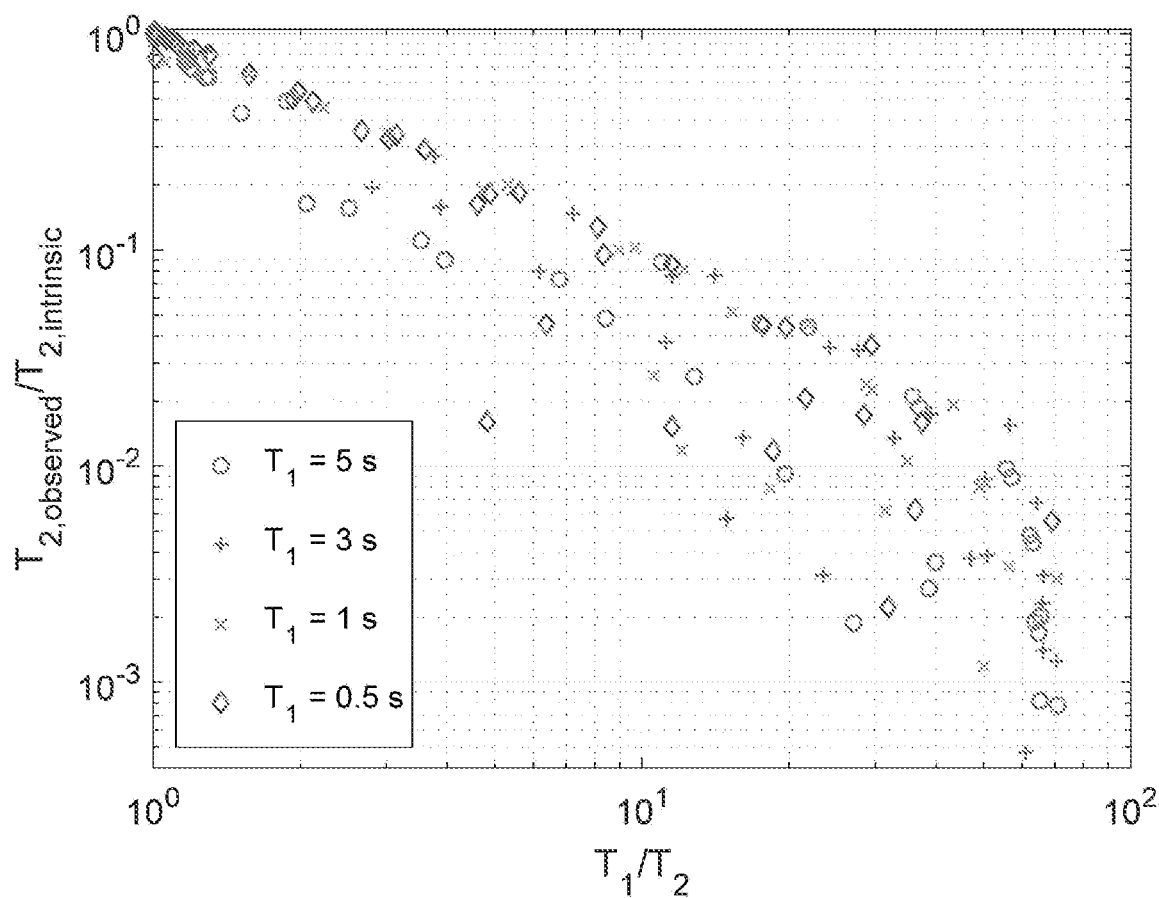
FIG. 8 depicts a plot of observed $T_2$ over intrinsic $T_2$ versus $T_1/T_2$.
Figure 7A:
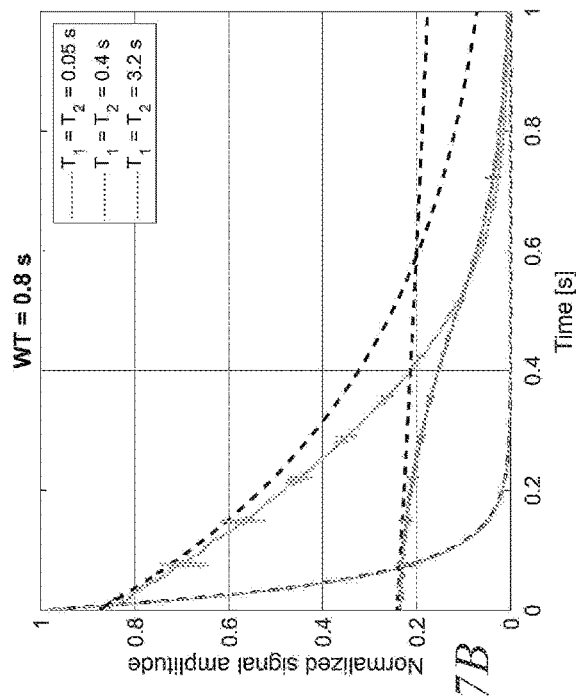
FIGS. 7A-7D shows simulated CPMG data for static and motion conditions.
Figure 7B:
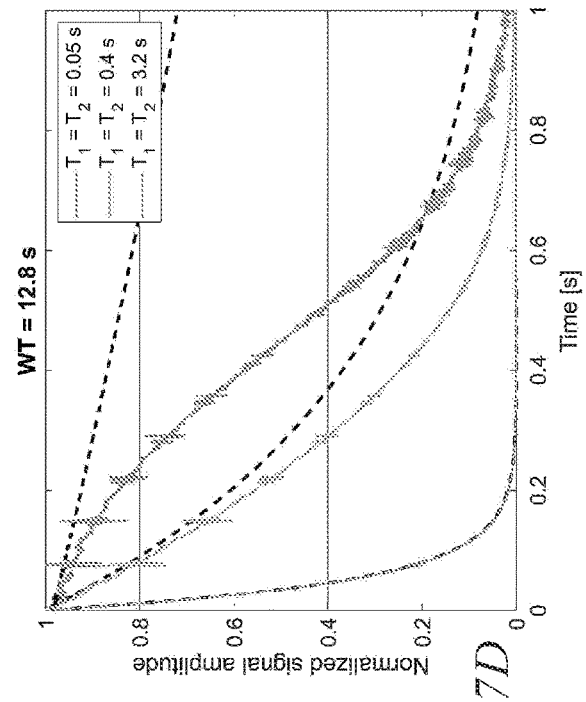
Figure 7C:
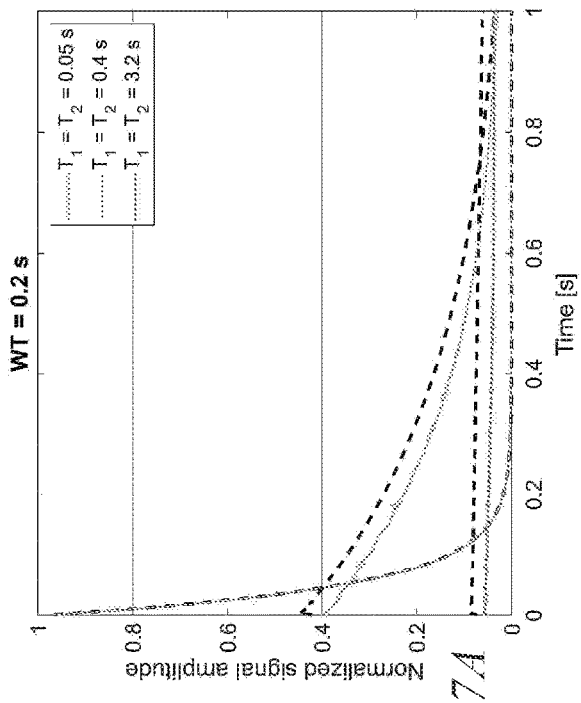
Figure 7D:
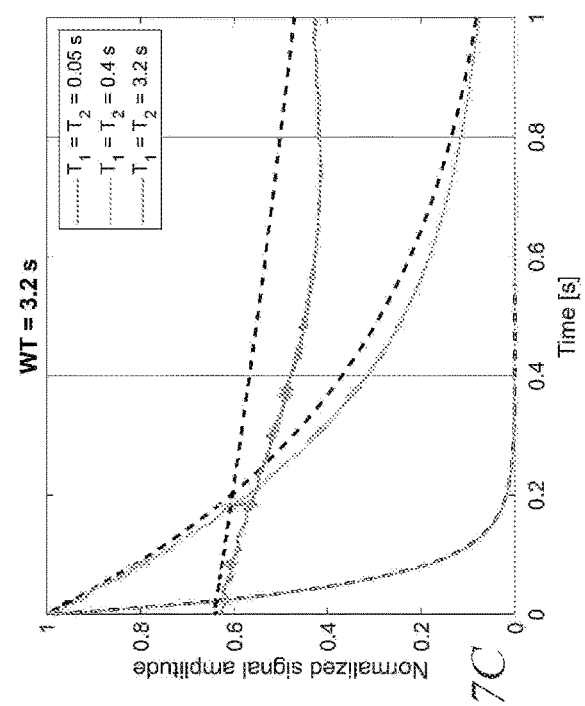

FIG. 8 plots a ratio of observed $T_2$ to intrinsic $T_2$ versus the apparent (or observed) $T_1/T_2$ ratio for four types of formation samples. As depicted in the plot legend, each sample type indicates a particular sample type with (○) representing a sample having $T_1=5$ seconds, (+) representing a sample having $T_1=3$ seconds, (x) representing a sample having $T_1=1$ second, and (◇) representing a sample having $T_1=0.5$ seconds). Each sample type was subject to simulated motion of numerous amplitudes and velocities as described below.

FIG. 8 shows a correlation between a reduction in observed $T_2$ and a variation in $T_1/T_2$ ratio introduced by motion. The location of the individual markers on the plot correlates well with the severity of the motion affect as measured by the ratio $T_1/T_2$. The ratio is close to 1 if the motion affect is minimal, but can be 10 or more or even nearly 100 if the motion is severe. In the absence of motion (or a motion affect), the markers should cluster at the upper left hand corner where $T_1/T_2=1$ and the intrinsic $T_2$ is equal to the observed $T_2$. As the motion severity increases, the marker position shifts to the lower right (i.e., increased $T_1/T_2$ ratio). As can be seen, there is a correlation between a reduction in the observed $T_2$ to intrinsic $T_2$ ratio and a higher $T_1/T_2$ ratio. In FIG. 8, circular motion was simulated at radius values of 0.5, 1, 2, 4, 8, 16, and 32 mm (7 levels)

and frequency values of 0.5, 1, 2, 4, 8, 16, 32, and 64 Hz (8 levels) for a total of 56 independent motion conditions (7×8).

As noted above, the reduction in observed $T_2$ over intrinsic $T_2$ and a higher $T_1/T_2$ ratio are indicative of motion. In the real world (practical) scenario in which both $T_1$ and $T_2$ may include a distribution of values, the $T_1/T_2$ ratio may be determined, for example, using a logarithmic mean of each distribution (i.e., $T_{1LM}$ and $T_{2LM}$) or using a mean of the portions of the distribution that corresponds to free fluid (i.e., $T_{1LM,FF}$ and $T_{2LM,FF}$). The disclosed embodiments are of course not limited in this regard.

With continued reference to FIG. 8, it will be understood that undesirable motion may be understood to be present if the computed (apparent, observed) $T_1/T_2$ ratio exceeds a pre-defined threshold. As described in more detail below, in some embodiments, data collected during these periods of motion (e.g., the NMR data and any associated answer products) as well as other data susceptible to motion may be identified as potentially compromised. In some embodiments, identification of motion may dictate changing drilling parameters (e.g., weight on bit, rotation rate, pump speed, etc.) in an effort to mitigate the undesirable motion (e.g., whirl), which may be done manually or automatically, e.g., by a rig system. The pre-defined threshold may depend on the tool type (operating frequency), formation properties, and/or other considerations. For example, in some embodiments, a $T_1/T_2$ ratio of 3 or greater may be indicative of undesirable motion. In some embodiments, for LWD NMR tools operating at low frequencies (e.g., ~300 kHz) a $T_1/T_2$ ratio of 4 or greater (e.g., about 4 or greater) may indicate undesirable motion. In some embodiments in which the NMR measurements are made at a much higher frequency, a $T_1/T_2$ ratio of 10 or greater, or even 30 or greater, may be indicative of undesirable motion.

With reference again to FIG. 6, the NMR data may alternatively (or additionally) be processed to detect problematic motion in 206 without applying an inversion (e.g., a 2D inversion) to obtain $T_1$ and $T_2$. In one embodiment, the processing in 206 may include comparing a sum of echo amplitudes obtained over a first portion of the echo train with a sum of echo amplitudes obtained over a second portion of the echo train. For example, the processing in 206 may include computing first and second ratios of echo amplitudes. The first ratio may be computed for a sample having an unknown motion with respect to the NMR tool (i.e., the sample for which the motion will be evaluated). The first ratio may include a ratio of a sum of echo amplitudes over a first portion of the echo train to a sum of echo amplitudes over a second portion of the echo train. The second ratio may be computed for a sample that is static (essentially non-moving) with respect to the NMR tool (i.e., a control sample). The second ratio may include a sum of echo amplitudes over the first portion of the echo train to a sum of echo amplitudes over the second portion of the echo train. The first and second ratios may then be compared to one another with motion being indicated when the two ratios are not equal. In one example embodiment, the comparison may involve computing a ratio of the first ratio to the second ratio and comparing that ratio (the ratio of ratios) to a predetermined threshold.

The amplitude of the sum of the CPMG echoes (SE), when normalized by NEcho, is proportional to the product of porosity and the average $T_2$ (see Sezginer et al. "An NMR High-Resolution Permeability Indicator," SPWLA 40th Annual Logging Symposium, paper NNN (1999)). For a given pulse sequence and sample properties, SE may be formulated, for example, as follows:

$$SE = \sum_{n=1}^{NEcho} \int_0^\infty \int_0^\infty M_0 \left[1 - \exp\left(-\frac{WT}{T_1}\right)\right] \exp\left(-\frac{n \cdot TE}{T_2}\right) dT_1 dT_2 \quad (4)$$

where SE represents the sum of the echo amplitudes and $M_0$, WT, TE, and NEcho are as defined above with respect to Equation 3 and FIGS. 2-4. For the simplest case in which the $T_1$ and $T_2$ distributions are represented by their average values $\hat{T}_1$ and $\hat{T}_2$, Equation 4 may be approximated, for example, as follows:

$$SE \approx \sum_{n=1}^{NEcho} M_0 \left[1 - \exp\left(-\frac{WT}{\hat{T}_1}\right)\right] \exp\left(-\frac{n \cdot TE}{\hat{T}_2}\right) = \quad (5)$$

$$M(t=0) \sum_{n=1}^{NEcho} \exp\left(-\frac{n \cdot TE}{\hat{T}_2}\right)$$

where, as indicated in FIG. 4

$$M(t=0) = M_0 \left[1 - \exp\left(-\frac{WT}{\hat{T}_1}\right)\right].$$

Figure 9A:
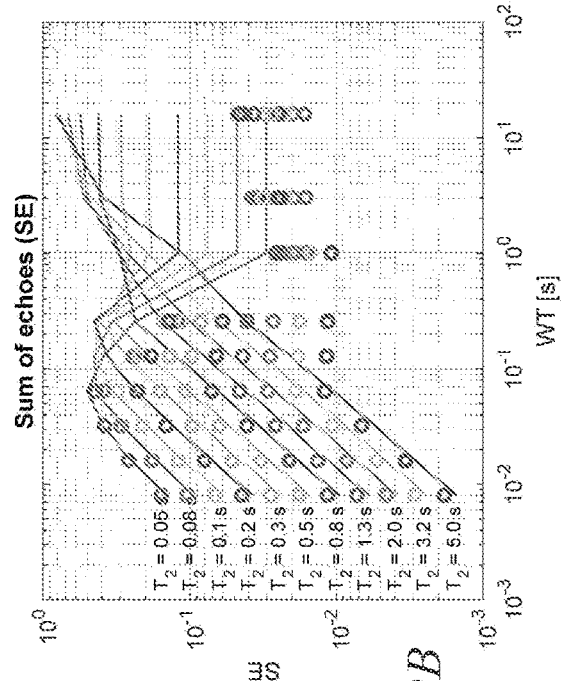
FIGS. 9A, 9B, 9C, and 9D (collectively FIG. 9) depict motion detection based on a sum of echoes.

Normalizing Equation 5 by the initial CPMG amplitude M(t=0), which is less affected by motion (see FIG. 9A, yields:

$$SE_{norm} = \sum_{n=1}^{NEcho} \exp\left(-\frac{n \cdot TE}{\hat{T}_2}\right) \quad (6)$$

where $SE_{norm}$ represents the normalized sum of the echoes (i.e., the normalized sum of the echo amplitudes). Note that Equation 6 reflects the acquisition of $T_2$ decay, which can be (severely) affected by motion as described above.

Figure 9B:
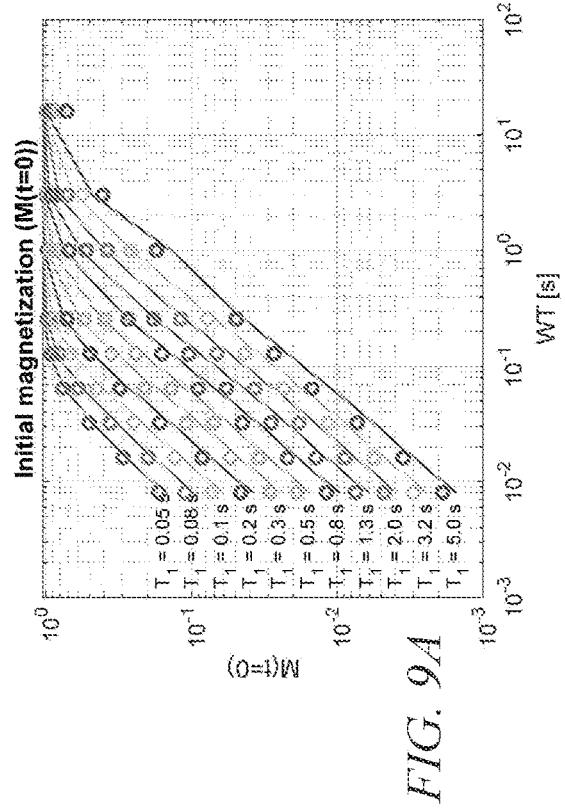
Figure 9C:
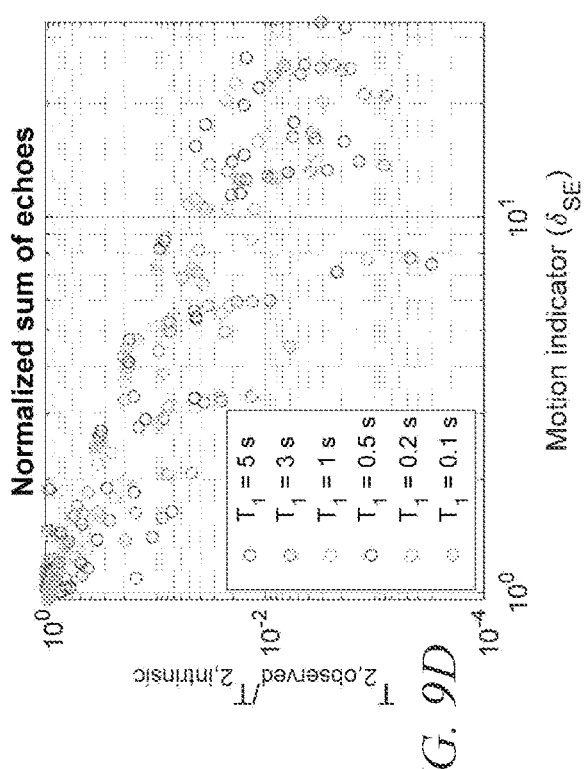
Figure 9D:
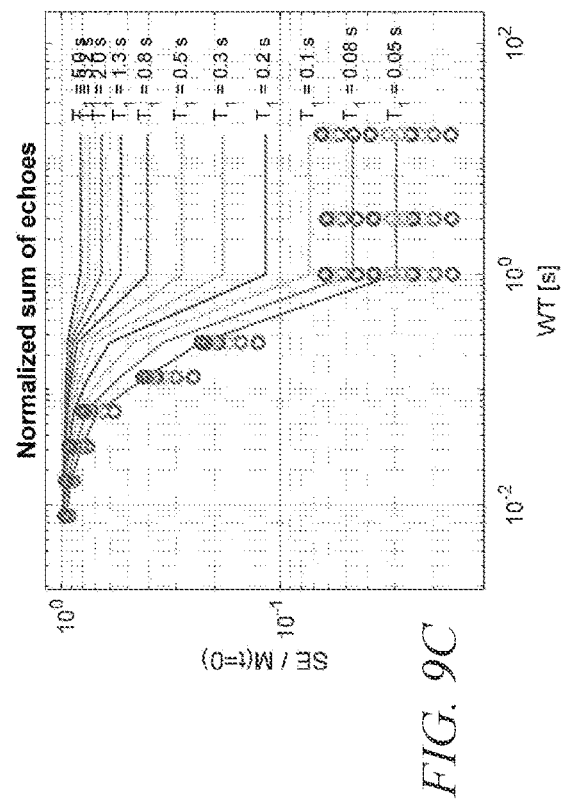

FIGS. 9A-9D (collectively FIG. 9) depict an example of motion detection based on the sum of echoes using the pulse sequence shown in Table 1. FIG. 9A shows the initial signal amplitude of each echo train M(t=0) as a function of the wait time WT and $T_1$. The colored lines indicate the theoretical values obtained from Eq. (3) (i.e., the static condition), while the colored markers represent values calculated under simulated circular motion having a radius of 16 mm and frequency of 4 Hz. The difference between markers and the lines indicate the motion effect. FIG. 9B shows the sum of echoes normalized by NEcho. FIG. 9C shows the sum of echoes FIG. 9B further normalized by the M(t=0) values shown on FIG. 9A (hence reflecting only $T_2$ acquisition). FIG. 9D shows the correlation between a reduction in observed $T_2$ and the motion indicator, which is described in more detail below.

TABLE 1

| Echo train# | ET1 | ET2 | ET3 | ET4 | ET5 | ET6 | ET7 | ET8 | ET9 |
|---|---|---|---|---|---|---|---|---|---|
| WT [ms] | 16000 | 3000 | 1000 | 256 | 128 | 64 | 32 | 16 | 8 |
| TE [ms] | 0.8 | 0.8 | 0.8 | 0.8 | 0.8 | 0.6 | 0.6 | 0.5 | 0.5 |

TABLE 1-continued

| Echo train# | ET1 | ET2 | ET3 | ET4 | ET5 | ET6 | ET7 | ET8 | ET9 |
|---|---|---|---|---|---|---|---|---|---|
| NEcho | 2048 | 2048 | 2048 | 256 | 128 | 64 | 32 | 16 | 8 |
| NRepeat | 1 | 1 | 2 | 4 | 8 | 16 | 32 | 64 | 64 |

Under static conditions (no motion as shown in the solid lines in FIG. 9), the ratio of the sum of the echo amplitudes SE of a short echo train (or echo train segment) to a long echo train (or echo train segment) is smaller for long $T_2$ samples than that for short $T_2$ samples. For example, compare short echo train segment ET9 in Table 1, (which is shown at the left-end of FIG. 9C) to that of long echo train segment ET1 in Table 1 (which is shown at the right-end of FIG. 9C). The ratio of the echo sums is increased (e.g., significantly increased by an order of magnitude) under motion (see the markers of corresponding colors in FIG. 9C which correspond to values calculated for circular motion having a radius of 16 mm and a frequency of 4 Hz). Based on the foregoing, a motion indicator may be defined, for example, as follows:

$$\delta_{SE} = \frac{SE_{norm\_long\_motion} / SE_{norm\_short\_motion}}{SE_{norm\_long\_static} / SE_{norm\_long\_static}} \quad (7)$$

where $\delta_{SE}$ is the motion indicator, $SE_{norm\_long\_motion}$ and $SE_{norm\_short\_motion}$ represent the normalized sum of the echoes (echo amplitudes) under motion for long and short echo train segments (e.g., long and short CPMG pulse segments) or long and short portions of an echo segment and $SE_{norm\_long\_static}$ and $SE_{norm\_short\_static}$ represent the normalized sum of the echoes (echo amplitudes) under static conditions for the same long and short echo train segments (or long and short portions of an echo segment). As expressed in Equation 7, the motion indicator $\delta_{SE}$ is a ratio of first and second ratios. The first ratio is a ratio of the normalized sum of the echoes for long and short echo trains during motion and the second ratio is a ratio of the normalized sum of the echoes for long and short echo train segments during static conditions.

It will be understood that Equation 7 is not limited to any particular portion of the pulse sequence shown in Table 1, nor to any particular pulse sequence. On the contrary, Equation 7 in its essence discloses that a motion indicator $\delta_{SE}$ may be computed using SE values computed from echo train segments having different lengths (i.e., in which the product of NEcho and TE are different) and different sensitivity to motion (as depicted in FIG. 9C).

For example, $SE_{norm\_long\_motion}$ and $SE_{norm\_long\_static}$ may be obtained from ET1 and $SE_{norm\_short\_motion}$ and $SE_{norm\_short\_static}$ may be obtained from ET9 given in Table 1. Likewise, $SE_{norm\_long\_motion}$ and $SE_{norm\_long\_static}$ may be obtained by summing the SE values obtained from ET1 and ET2 or by summing the SE values obtained from ET1, ET2, and ET3 and the $SE_{norm\_short\_motion}$ and $SE_{norm\_short\_static}$ may be obtained by summing the SE values obtained from ET8 and ET9 or by summing the SE values obtained from E71, ET8, and ET9. The disclosed embodiments are not limited in these regards.

Moreover, it will be further understood that the disclosed embodiments are expressly not limited to the particular pulse sequence (and the corresponding pulse segments) given in Table 1. Substantially any suitable pulse (echo) train may be used.

With continued reference to Equation 7, $SE_{norm\_long\_motion}$ and $SE_{norm\_short\_motion}$ are generally obtained during an NMR logging operation (e.g., at 204 in FIG. 8). $SE_{norm\_long\_static}$ and $SE_{norm\_short\_static}$ may be based on theory (i.e., based on simulated measurements) as described above or during a period of the logging operation when there is no significant motion (e.g., when drill bit is off bottom and rotation of the drill string has been suspended such as when a length of pipe is added to the drill string).

FIG. 9D depicts a plot of the observed to intrinsic $T_2$ ratio versus the motion indicator $\delta_{SE}$ for six different formations. In each formation $T_1$ was set equal to $T_2$ (at the values indicated). Circular motion was simulated at radius values of 0.5, 1, 2, 4, 8, 16, and 32 mm (7 levels) and frequency values of 0.5, 1, 2, 4, 8, 16, 32, and 64 Hz (8 levels) for a total of 56 independent motion conditions (7×8). FIG. 9D shows the correlation between the motion indicator $\delta_{SE}$ and corresponding simulated motion (calculated via Equation 7). In this particular example, the motion indicator was computed via Equation 7 with $SE_{norm\_long\_motion}$ and $SE_{norm\_long\_static}$ being obtained from ET1 and $SE_{norm\_short\_motion}$ and $SE_{norm\_short\_static}$ being obtained from ET9 given in Table 1. Each marker represents the value of $\delta_{SE}$ under different circular motion characterized by a combination of radius and frequency (as described above). There is a clear correlation between the motion indicator $\delta_{SE}$ and the reduction in observed $T_2$. In practice, undesirable motion may be determined to be present if the motion indicator value $\delta_{SE}$ value exceeds a pre-defined threshold. Since the sum of many echoes yields a high signal-to-noise ratio, this disclosed method advantageously enables motion detection without data stacking (or averaging) and thus enables rapid determination and mitigation when problematic motion arises.

As described in more detail below, in some embodiments, the data associated with motion (e.g., the NMR data and any associated answer products) as well as other data susceptible to motion may be identified as potentially compromised. In some embodiments, identification of motion may dictate changing drilling parameters (e.g., weight on bit, rotation rate of the drill string, pump speed, etc.) in an effort to mitigate the undesirable motion (e.g., whirl), which may be done manually or automatically, e.g., by a rig system. The pre-defined threshold may depend on the tool type (operating frequency), pulse sequence, formation properties, and/or other considerations. In some embodiments, $\delta_{SE} \geq 1.5$ may be selected as the threshold to indicate undesirable motion. In some embodiments, $\delta_{SE} \geq 3$ may be selected as the threshold to indicate undesirable motion. In some embodiments, $\delta_{SE} \geq 10$ may be selected as the threshold to indicate undesirable motion.

If problematic motion is detected during tool operation (e.g., determined to be greater than a predetermined threshold), data may be flagged as suspect over the affected interval. Also, it may be possible to mitigate the motion-related problem by adjusting drilling parameters (e.g., weight on bit, surface RPM, etc.) to reduce or mitigate lateral or other problematic motion. For example, if motion is detected according to the above described embodiments, a warning signal can be sent uphole via telemetry using an MWD tool or otherwise, and a driller or an automated drilling system may adjust drilling parameters. For example, a driller may reduce weight on bit, may reduce surface RPM, may reduce mud flow rate, etc. Moreover, as described above, in some embodiments, reducing lateral motion improves the quality of NMR data and may further reduce potentially damage to downhole BHA tools.

It will be understood that the disclosure includes numerous embodiments. These embodiments include, but are not limited to, the following embodiments.

In a first embodiment a method is disclosed for detecting net relative motion between a nuclear magnetic resonance (NMR) tool and a specimen. The method includes (a) disposing the NMR tool and the specimen in sensory range of one another; (b) causing the NMR tool to make NMR measurements of the specimen; and (c) processing the NMR measurements to detect net relative motion between the NMR tool and the specimen.

A second embodiment may include the first embodiment wherein the NMR tool is an NMR logging while drilling tool and the specimen is a subterranean formation or a wellbore fluid; and (a) comprises rotating a drill string on which the NMR logging tool is deployed in a wellbore to drill.

A third embodiment may include the second embodiment and may further include (d) changing a weight on bit or a rotation rate of the drill string while drilling in (a) when said net relative motion is greater than a predetermined threshold.

A fourth embodiment may include any one of the first and second embodiments and may further include (d) flagging the NMR measurements in (b) for which said net relative motion is greater than a predetermined threshold.

A fifth embodiment may include any one of the first through fourth embodiments wherein (c) comprises: (i) processing the NMR measurements to compute a longitudinal relaxation time $T_1$ of the specimen and a transverse relaxation time $T_2$ of the specimen; (ii) computing a ratio of said $T_1$ and $T_2$ relaxation times computed in (i); (iii) comparing the ratio computed in (ii) with a predetermined threshold, wherein a ratio greater than the threshold is indicative of the relative motion between the NMR tool and the specimen.

A sixth embodiment may include the fifth embodiment, wherein the threshold is about 4 or greater.

A seventh embodiment may include any one of the first through third embodiments wherein: the NMR measurements comprise interrogating the specimen with a train of radio frequency pulses and measuring a corresponding train of echo amplitudes; and (c) further comprises comparing a sum of echo amplitudes over a first portion of said echo train with a sum of echo amplitudes over a second portion of said echo train.

An eighth embodiment may include the seventh embodiment wherein (c) further comprises: computing a first ratio for which the sample has an unknown motion, the first ratio being a ratio of a sum of echo amplitudes over the first portion of said echo train to a sum of echo amplitudes over the second portion of said echo train; computing a second ratio for which the sample is static, the second ratio being a sum of echo amplitudes over the first portion of said echo train to a sum of echo amplitudes over the second portion of said echo train; and comparing the first ratio with the second ratio, wherein motion is indicated when the first ratio is not equal to the second ratio.

A ninth embodiment may include the eighth embodiment wherein the first portion of said echo train comprises a long duration segment of the echo train and the second portion of said echo train comprises a short duration segment of the echo train.

A tenth embodiment may include the eighth embodiment wherein the second ratio is computed from simulated NMR measurements based on theory.

An eleventh embodiment may include the eighth embodiment wherein said comparing the first ratio with the second ratio comprises computing a ratio of the first ratio to the second ratio and comparing said ratio with a predetermined threshold.

A twelfth embodiment may include the eleventh embodiment wherein the threshold is greater than 1.5.

In a thirteenth embodiment a system for detecting relative motion between a nuclear magnetic resonance (NMR) tool and a specimen is disclosed. The system includes an NMR tool configured for making NMR measurements of the specimen and a processor configured to process the NMR measurements to detect net relative motion between the NMR tool and the specimen.

A fourteenth embodiment may include the thirteenth embodiment wherein the processor is configured to: (i) process the NMR measurements to compute a longitudinal relaxation time $T_1$ of the specimen and a transverse relaxation time $T_2$ of the specimen; (ii) compute a ratio of said $T_1$ and $T_2$ relaxation times computed in (i); and (iii) compare the ratio computed in (ii) with a predetermined threshold, wherein a ratio greater than the threshold is indicative of the relative motion between the NMR tool and the specimen.

A fifteenth embodiment may include the thirteenth embodiment wherein: the NMR tool is configured to make NMR measurements via interrogating the specimen with a train of radio frequency pulses and measuring a corresponding train of echo amplitudes; and wherein the processor is configured to: (i) compute a first ratio for which the sample has an unknown motion, the first ratio being a ratio of a sum of echo amplitudes over a first portion of said echo train to a sum of echo amplitudes over a second portion of said echo train; (ii) compute a second ratio for which the sample is static, the second ratio being a sum of echo amplitudes over the first portion of said echo train to a sum of echo amplitudes over the second portion of said echo train; and (iii) compare the first ratio with the second ratio, wherein motion is indicated when the first ratio is not equal to the second ratio.

The embodiments of the NMR motion detection system and method have been primarily described with reference for use with LWD NMR tools; such systems and methods may be used in applications other than the drilling of a wellbore. In other embodiments, calibration systems according to the present disclosure may be used in wireline operations, however, other potential uses can be envisioned. Accordingly, the terms "wellbore," "borehole" and the like should not be interpreted to limit tools, systems, assemblies, or methods of the present disclosure to any particular industry, field, or environment.

One or more specific embodiments of the present disclosure are described herein. These described embodiments are examples of the presently disclosed techniques. Additionally, in an effort to provide a concise description of these embodiments, not all features of an actual embodiment may be described in the specification. It should be appreciated that in the development of any such actual implementation, as in any engineering or design project, numerous embodiment-specific decisions will be made to achieve the developers' specific goals, such as compliance with system-related and business-related constraints, which may vary from one embodiment to another. Moreover, it should be appreciated that such a development effort might be complex and time consuming, but would nevertheless be a routine undertaking of design, fabrication, and manufacture for those of ordinary skill having the benefit of this disclosure.

Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

The terms "approximately," "about," and "substantially" as used herein represent an amount close to the stated amount that is within standard manufacturing or process tolerances, or which still performs a desired function or achieves a desired result. For example, the terms "approximately," "about," and "substantially" may refer to an amount that is within less than 5% of, within less than 1% of, within less than 0.1% of, and within less than 0.01% of a stated amount. Further, it should be understood that any directions or reference frames in the preceding description are merely relative directions or movements. For example, any references to "up" and "down" or "above" or "below" are merely descriptive of the relative position or movement of the related elements.

What is claimed is:

1. A method for detecting net relative motion between a nuclear magnetic resonance (NMR) tool and a specimen, the method comprising:
   (a) disposing the NMR tool and the specimen in sensory range of one another;
   (b) causing the NMR tool to make NMR measurements of the specimen, wherein the causing the NMR tool to make the NMR measurements comprises interrogating the specimen with a train of radio frequency pulses and measuring a corresponding train of echo amplitudes; and
   (c) processing the NMR measurements to detect the net relative motion between the NMR tool and the specimen, wherein the processing the NMR measurements comprises comparing a sum of echo amplitudes over a first portion of the echo train with a sum of echo amplitudes over a second portion of the echo train.

2. The method of claim 1, wherein:
   the NMR tool is an NMR logging while drilling tool and the specimen is a subterranean formation or a wellbore fluid; and
   (a) comprises rotating a drill string on which the NMR logging while drilling tool is deployed in a wellbore to drill.

3. The method of claim 2, further comprising:
   (d) changing a weight on bit or a rotation rate of the drill string while drilling in (a) when the net relative motion is greater than a predetermined threshold.

4. The method of claim 1, further comprising:
   (d) flagging the NMR measurements in (b) for which the net relative motion is greater than a predetermined threshold.

5. The method of claim 1, wherein (c) further comprises:
   (i) processing the NMR measurements to compute a longitudinal relaxation time $T_1$ of the specimen and a transverse relaxation time $T_2$ of the specimen;
   (ii) computing a ratio of the $T_1$ relaxation time and the $T_2$ relaxation time computed in (i);
   (iii) comparing the ratio computed in (ii) with a predetermined threshold, wherein a ratio greater than the predetermined threshold is indicative of the net relative motion between the NMR tool and the specimen.

6. The method of claim 5, wherein the predetermined threshold is about 4 or greater.

7. The method of claim 1, wherein (c) further comprises:
   computing a first ratio for which the specimen has an unknown motion, the first ratio being a ratio of a sum of echo amplitudes over the first portion of the echo train to a sum of echo amplitudes over the second portion of the echo train;
   computing a second ratio for which the specimen is static, the second ratio being a sum of echo amplitudes over the first portion of the echo train to a sum of echo amplitudes over the second portion of the echo train; and
   comparing the first ratio with the second ratio, wherein the net relative motion is indicated when the first ratio is not equal to the second ratio.

8. The method of claim 7, wherein the first portion of the echo train comprises a long duration segment of the echo train and the second portion of the echo train comprises a short duration segment of the echo train.

9. The method of claim 7, wherein the second ratio is computed from simulated NMR measurements based on theory.

10. The method of claim 7, wherein the comparing the first ratio with the second ratio comprises computing a ratio of the first ratio to the second ratio and comparing the ratio with a predetermined threshold.

11. The method of claim 10, wherein the predetermined threshold is greater than 1.5.

12. A system for detecting net relative motion between a nuclear magnetic resonance (NMR) tool and a specimen, the system comprising:
   an NMR tool configured for making NMR measurements of the specimen, wherein the NMR tool is configured to make the NMR measurements via interrogating the specimen with a train of radio frequency pulses and measuring a corresponding train of echo amplitudes; and
   a processor configured to process the NMR measurements to detect the net relative motion between the NMR tool and the specimen, wherein the processor is further configured to:

(i) compute a first ratio for which the specimen has an unknown motion, the first ratio being a ratio of a sum of echo amplitudes over a first portion of the echo train to a sum of echo amplitudes over a second portion of the echo train;

(ii) compute a second ratio for which the specimen is static, the second ratio being a sum of echo amplitudes over the first portion of the echo train to a sum of echo amplitudes over the second portion of the echo train; and (iii) compare the first ratio with the second ratio, wherein the net relative motion is indicated when the first ratio is not equal to the second ratio.

13. The system of claim 12, wherein the processor is further configured to:

(iv) process the NMR measurements to compute a longitudinal relaxation time $T_1$ of the specimen and a transverse relaxation time $T_2$ of the specimen;

(v) compute a ratio of the $T_1$ relaxation time and the $T_2$ relaxation time computed in (iv); and (vi) compare the ratio computed in (v) with a predetermined threshold, wherein a ratio computed in (v) greater than the predetermined threshold is indicative of the net relative motion between the NMR tool and the specimen.

14. The system of claim 12, wherein the first portion of the echo train comprises a long duration segment of the echo train and the second portion of the echo train comprises a short duration segment of the echo train.

15. The system of claim 12, wherein the second ratio is computed from simulated NMR measurements based on theory.

16. The system of claim 12, wherein the comparing the first ratio with the second ratio comprises computing a ratio of the first ratio to the second ratio and comparing the ratio with a predetermined threshold.

17. A method for detecting net relative motion between a nuclear magnetic resonance (NMR) tool and a specimen, the method comprising:

(a) disposing the NMR tool and the specimen in sensory range of one another;

(b) causing the NMR tool to make NMR measurements of the specimen; and (c) processing the NMR measurements to detect the net relative motion between the NMR tool and the specimen, wherein the processing the NMR measurements comprises:

(i) processing the NMR measurements to compute a longitudinal relaxation time $T_1$ of the specimen and a transverse relaxation time $T_2$ of the specimen;

(ii) computing a ratio of the $T_1$ relaxation time and the $T_2$ relaxation time computed in (i);

(iii) comparing the ratio computed in (ii) with a predetermined threshold, wherein a ratio greater than the predetermined threshold is indicative of the net relative motion between the NMR tool and the specimen, and wherein the predetermined threshold is about 4 or greater.

18. The method of claim 17, wherein:

the NMR tool is an NMR logging while drilling tool and the specimen is a subterranean formation or a wellbore fluid; and (a) comprises rotating a drill string on which the NMR logging while drilling tool is deployed in a wellbore to drill.

19. The method of claim 18, further comprising:

(d) changing a weight on bit or a rotation rate of the drill string while drilling in (a) when the net relative motion is greater than the predetermined threshold.

20. The method of claim 17, further comprising:

(d) flagging the NMR measurements in (b) for which the net relative motion is greater than the predetermined threshold.

* * * * *